United States Patent [19]

Ogata et al.

[11] Patent Number: 5,032,570

[45] Date of Patent: Jul. 16, 1991

[54] METHOD FOR PRODUCING CERAMIC SUPERCONDUCTING MATERIAL USING INTERMEDIATE PRODUCTS

[75] Inventors: Yasunobu Ogata; Toshiyuki Kasakoshi, both of Kumagaya; Yusuke Iyori, Fukaya; Kenzi Maruta; Tsutomu Iimura, both of Kumagaya, all of Japan

[73] Assignee: Hitachi Metals, Ltd., Tokyo, Japan

[21] Appl. No.: 220,708

[22] Filed: Jul. 18, 1988

[30] Foreign Application Priority Data

Aug. 4, 1987 [JP] Japan ................... 62-195093
Aug. 4, 1987 [JP] Japan ................... 62-195094

[51] Int. Cl.$^5$ ............... C01B 13/00; C01F 17/00; C01G 3/02; C04B 35/00
[52] U.S. Cl. ................................. 505/1; 252/521; 423/593; 423/604; 423/635; 501/94; 501/123; 501/126; 505/725
[58] Field of Search ............... 423/593, 604, 617, 624, 423/635; 502/340, 341, 345, 346, 344, 353, 354; 501/123, 126, 94; 252/521; 505/1

[56] References Cited

U.S. PATENT DOCUMENTS

| | | | |
|---|---|---|---|
| 3,355,282 | 11/1967 | Kudo et al. | 502/341 |
| 3,850,850 | 11/1974 | Collins | 252/465 |
| 4,186,112 | 1/1980 | Vogt et al. | 502/345 |
| 4,408,067 | 10/1983 | Nakamura et al. | 502/353 |
| 4,857,504 | 8/1989 | Hermann et al. | 505/1 |

FOREIGN PATENT DOCUMENTS 3817319 12/1988 Fed. Rep. of Germany .......... 505/1

OTHER PUBLICATIONS

K. Matsuzaki et al., "Preparation of a High Tc Superconductor by Oxidization of an Amorphous La$_{1.8}$Sr$_{0.2}$Cu Alloy Ribbon in Air", Jpn. J. Appl. Phys., vol. 26, No. 4, Apr. 1987, pp. L334–L336.

S. J. Hwu et al., "Subsolidus Compatibilities in the Y$_2$O$_3$–BaO–CuO System via Diamagnetic Susceptibility", J. Am. Ceram. Soc., vol. 70, No. 7, Jul. 1987, pp. C-165–C-167.

H. Takei et al., "Growth of YBa$_2$Cu$_3$O$_x$ Single Crystals with Superconducting Transition Above 90 K", Jpn. J. Appl. Phys., vol. 26, No. 9, Sep. 1987, pp. L1425–L1427.

C. Politis, J. Geerk, M. Dietrich, B. Obst, and H. L. Luo, "Superconductivity above 100 K in Multi-Phase Y–Ba–Cu–O", Z. Phys. B-Condensed Matter, vol. 66, 1987, pp. 279–282.

Kinzoku Jihyo No. 1317, pp. 351–353 (and translation in English).

Cara et al, "Bulk Syperconductivity at 91K in Single-–Phase Oxygen-Deficient Perovskite Ba$_2$YCu$_3$O$_{9-8}$", Physical Review Lett., vol. 58, No. 16, 4/20/87, pp. 1676–1679.

*Primary Examiner*—Paul Lieberman
*Assistant Examiner*—John Boyd

[57] ABSTRACT

This invention provides a method for producing an oxide superconductor which has a uniform texture and is markedly high in sintered density and current density.

The method involves the formation of intermediate products from the starting materials. The intermediate products are then used to form the final product. Specifically, to form an oxide superconducting material having a compositional formula YBa$_2$CU$_3$O$_{7-8}$, where 8 is more than zero but less than 0.5, the method of the invention includes forming a first intermediate product of Y$_2$CU$_2$O$_5$, forming a second intermediate product of BaCuO$_2$, mixing the first and second intermediate products, and sintering the intermediate product mixture to form the oxide superconducting material.

4 Claims, 2 Drawing Sheets

METHOD FOR PRODUCING CERAMIC SUPERCONDUCTING MATERIAL USING INTERMEDIATE PRODUCTS

BACKGROUND OF THE INVENTION

This invention relates to a method for producing superconducting materials of oxide type ceramics and, more particularly, to a method for producing superconducting materials which is improved so that raw materials can readily be uniformly mixed, localization of composition can be prevented and thus uniform compositions can be obtained.

Known superconducting materials include metals (Pb, Hg, La, Ta, Sn, Ti, Zn, In, Nb, Al, V, Tc and the like), alloys (Nb-Tc, Nb-Zr and the like), compounds ($Nb_3Sn$, $V_3Si$, $V_3Ga$, $Nb_3Ge_{0.3}Al_{0.7}$, $Nb_3Sn$, $CeCu_2Si_2$, $Mo_6Se_8$, $PbMo_{6.4}S_8$, $SnMo_6S_8$, $SrTiO_3$, $BaPb_{0.9}$, $Bi_{0.1}O_3$, $LiTi_2O_4$ and the like) and organic materials (TMTSF, BEDT-TTF and the like). Important characteristics of superconducting materials are (1) zero electrical resistance, (2) perfect diamagnetism (Meissner effect) and (3) the Josephson effect. When these materials are utilized for power transmission, power distribution and power generation as a result of the characteristic that their electrical resistance is 0, one of the advantages obtained is that a large current can be obtained with only a small loss thereof. Recently, among the above superconducting materials, oxide type ceramics have been explored in detail because they have a high critical temperature.

The ceramic superconducting materials are generally synthesized by application of powder metallurgy. That is, for example, Y-Ba-Cu-O ceramics (YBCO) are obtained by mixing powders of raw materials $BaCO_3$, $Y_2O_3$ and CuO, calcining the mixture at 900° C. to carry out a solid phase reaction, then grinding the mixture and press molding the resulting powder into pellets and then sintering the molded product in an oxygen atmosphere. In this case, uniformly mixing the above three raw material powders is relatively difficult and besides, mixing requires a long time due to the difference in specific gravity, shape and particle size. Furthermore, there is a problem that the raw materials which constitute the superconducting materials or BaO and CuO in the course of the reaction become liquid phase, which remains as a non-superconducting phase mainly composed of CuO even after cooling, resulting in a reduction of current density. A further problem is that the sintered density decreases owing to the local presence of CuO.

OBJECT AND SUMMARY OF THE INVENTION

The object of this invention is to provide a method for producing superconducting materials having a uniform texture and a high sintered density and current density without any of the problems mentioned above.

In order to solve the problems in the conventional techniques, this invention provides a method for production of oxide type superconducting materials of layered perovskite structure containing Cu (copper) and O (oxygen) as basic constituting elements wherein a raw material CuO and the other raw material, i.e., a carbonate or oxide or mixture thereof are allowed to react previously to obtain at least one intermediate product containing Cu and O and then these intermediate products (in cases where two or more intermediate products are produced) or the intermediate product and other raw material (in cases where only one intermediate product is produced) are subjected to final reaction to obtain an oxide of a layered perovskite structure having the desired final composition and texture.

Specifically, in the method for producing a ceramic superconducting material having the compositional formula: $A_1B_2C_3O_{7-\delta}$ wherein A is at least one selected from Sc, Y, La, Ce, Pr, Nd, Sm, Eu, Gd, Tb, Dy, Ho, Er, Tm, Yb and Lu or a mixture of two or more of them, B is at least one selected from Ba, Sr and Ca or a mixture of two or more of them, C is Cu or a Cu based mixture of Cu with at least one selected from Ti, V, Cr, Mn, Fe, Co, Ni and Zn or with two or more of them, and $\delta$ is more than zero but less than 0.5; raw materials comprising compounds containing A and C, respectively are mixed and then the mixture is calcined to produce an oxide containing A and C and separately raw materials comprising compounds containing B and C, respectively are mixed and then the mixture is calcined to obtain an oxide containing B and C and the resulting two oxides are mixed and sintered in an oxygen atmosphere.

According to another specific method, $Bi_2O_3$ and CuO are mixed and the mixture is calcined to produce a first intermediate product containing Bi and Cu of the above two oxides. Simultaneously, $SrCO_3$, $CaCO_3$ and CuO are mixed and the mixture is calcined to produce a second intermediate product containing Sr, Ca and Cu. The first intermediate product and the second intermediate product are mixed and the mixture is sintered in an oxygen atmosphere to obtain Bi-Sr-Ca-Cu-O type oxide of layered perovskite structure.

DETAILED DESCRIPTION OF THE INVENTION

According to the above construction, there can be expected an effect to prevent nonuniformity and localization of specific components caused by differences in specific gravity, shape of particles and particle size of a number of raw materials and to obtain uniform texture. A further effect is to inhibit the presence of a non-superconducting phase such as a phase mainly composed of CuO which has a great influence on the characteristics of superconducting materials.

EXAMPLE 1

First, as raw materials, powdered $Y_2O_3$ and CuO were weighed so that Y:Cu was 1:1 and then were homogeneously mixed. The mixture was calcined at 900° C. for 3 hours in an oxidizing atmosphere to obtain an oxide having the composition of $Y_2Cu_2O_5$. Then, powdered $BaCO_3$ and CuO were weighed so that Ba:Cu was 1:1 and homogeneously mixed and calcined in the same manner as above to obtain an oxide having the composition $BaCuO_2$. These two oxides were disintegrated and ground and were weighed so that Y:Ba:Cu was 1:2:3 and then molded into pellets of 25 mm in diameter × 5 mm. The pellets were sintered at 1000° C. for 4 hours in an oxygen atmosphere to produce a superconducting material of a triple-layer perovskite structure deficient in oxygen. The average particle size of powders in the above steps is preferably 0.2–0.5 μm. The characteristics of the resulting superconducting material were measured to obtain a critical temperature of 91K and a current density of 5000 A/cm².

Figure 2:
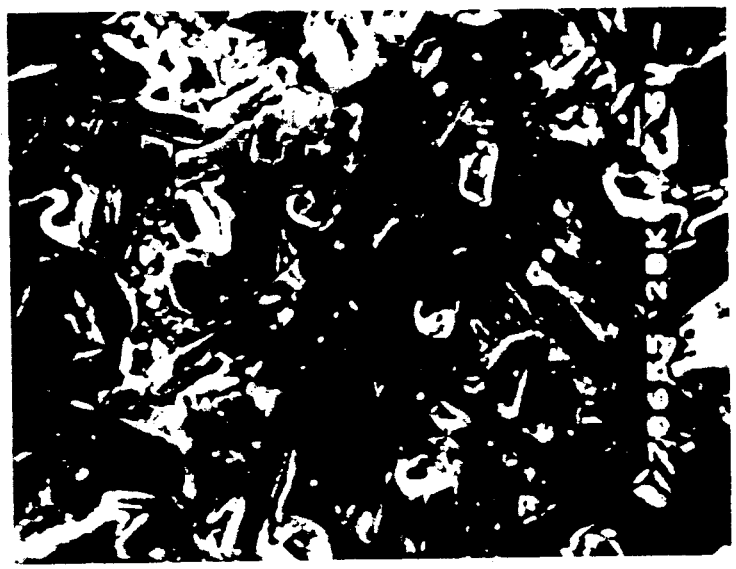
FIG. 1 and FIG. 2 are photographs which show the crystal structure of the superconducting material of one example according to this invention and a conventional superconducting material, respectively.
Figure 1:
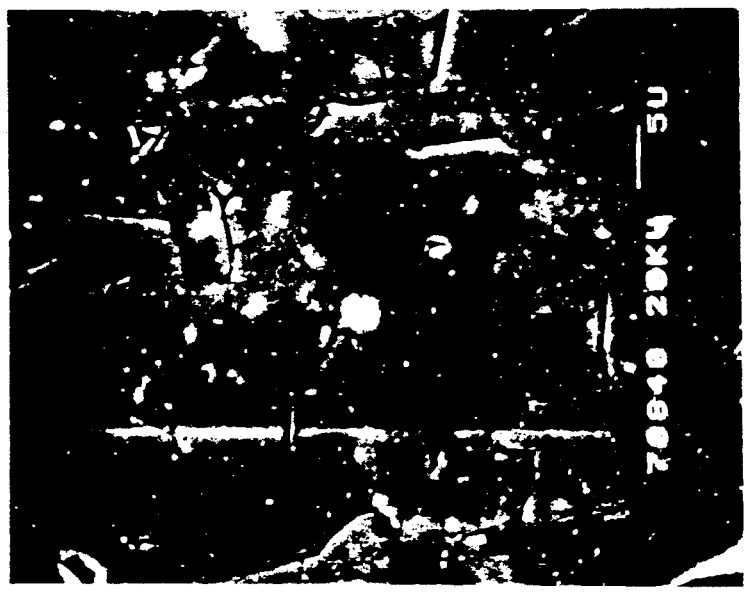

FIGS. 1 and 2 are photographs which show the crystal structure of the superconducting material obtained in this example and a conventional superconducting material, respectively. In these photographs, black portions are cavities or vacancies which are discontinuous portions in crystal structure. As is clear from these figures, the material of this example of FIG. 1 had very few vacancy portions and had a high sintered density. On the other hand, in FIG. 2 which shows a conventional superconducting material indicates a great number of vacancy portions and this means a low sintered density. The sintered density of the former was 95% and that of the latter was 60–70%.

Although the explanation above is referring to the example of Y-Ba-Cu-O system ceramics, the same effect can be generally expected on the ceramics of the compositional formula: $A_1B_2C_3O_{7-\delta}$ wherein A is one element selected from Sc, Y, La, Ce, Pr, Nd, Sm, Eu, Gd, Tb, Dy, Ho, Er, Tm, Yb and Lu or a mixture of two or more of these elements; B is one element selected from Ba, Sr and Ca or a mixture of two or more of these elements; C is Cu or a mixture mainly composed of Cu which comprises Cu with one element selected from Ti, V, Cr, Mn, Fe, Co, Ni and Zn or with two or more elements selected from these elements, and δ is more than zero but less than 0.5. It is effective for obtaining a further uniform texture to mix an oxide containing A and C and an oxide containing B and C and then calcine the mixture in the same manner as above.

This invention has the effects based on the above-mentioned construction and such an action that superconducting materials having a uniform texture and markedly high sintered density and current density can very easily be produced.

EXAMPLE 2

First, as raw materials, powdered $Y_2O_3$ and CuO were weighed at Y:Cu=1:1 and were homogeneously mixed. The mixture was calcined at 900° C. for 3 hours in an oxidizing atmosphere to produce an oxide having the composition of $Y_2Cu_2O_5$. This oxide was ground and the resulting powder of the oxide and powdered $BaCO_3$ and CuO were weighed so as to obtain Y:Ba:Cu=1:2:3 and were molded into pellets of 25 mm in diameter×5 mm. These pellets were sintered at 1000° C. for 4 hours in an oxygen atmosphere to produce a superconducting material of triple-layer perovskite structure deficient in oxygen. Average particle size of the powders in the above steps is preferably 0.2–0.5 μm. The characteristics of the thus obtained superconducting material were measured to obtain a critical temperature of 91K and a current density of 5000 A/cm². The material had a sintered density of 95%.

Although the explanation above is referring to the example of Y-Ba-Cu-O system ceramics, the same action can be expected on the ceramics of the compositional formula: $A_1B_2C_3O_{7-\delta}$ wherein A is one element selected from Sc, Y, La, Ce, Pr, Nd, Sm, Eu, Gd, Tb, Dy, Ho, Er, Tm, Yb and Lu or a mixture of two or more of these elements; B is one element selected from Ba, Sr and Ca or a mixture of two or more of these elements; C is Cu or a mixture mainly composed of Cu which comprises Cu with one element selected from Ti, V, Cr, Mn, Fe, Co, Ni and Zn or with two or more elements selected from these elements; and δ is more than zero but less than 0.5. It is effective for obtaining a further uniform texture to mix an oxide containing A and C in the above compositional formula and an oxide containing B and C and then calcine the mixture in the same manner as above.

This invention has the effects based on the above-mentioned construction and such an action that superconducting materials having a uniform texture and markedly high in sintered density and current density can very easily be produced.

EXAMPLE 3

First, as raw materials, powdered $BaCO_3$ and CuO were weighed at Ba:Cu=1:1 and were homogeneously mixed. The mixture was calcined at 900° C. for 3 hours in an oxidizing atmosphere to produce an oxide having the composition of $BaCuO_2$. This oxide was ground and the resulting powder of the oxide and powdered $Y_2O_3$ and CuO were weighed so as to obtain Y:Ba:Cu=1:2:3 and were molded into pellets of 25 mm in diameter×5 mm. These pellets were sintered at 1000° C. for 4 hours in an oxygen atmosphere to produce a superconducting material of a triple-layer perovskite structure deficient in oxygen. The average particle size of the powders in the steps above is preferably 0.2–0.5 μm. The characteristics of the thus obtained superconducting material were measured to obtain a critical temperature of 91K and a current density of 1000 A/cm². The material had a sintered density of 95%.

A target material of 100 mm in diameter and 5 mm in thickness was prepared from the above composition and held on a backing plate and a thin film of $YBa_2Cu_3O_{7-\delta}$ having a thickness of 5000 Å was formed by a sputtering method comprising irradiation with Ar ion. The characteristics of this thin film were measured to obtain a critical temperature of 90K and a current density of 2500 A/cm².

Although the explanation above is referring to the example of Y-Ba-Cu-O system ceramics, the same action can be expected on the ceramics of the compositional formula: $A_1B_2C_3O_{7-\delta}$ wherein A is one element selected from Sc, Y, La, Ce, Pr, Nd, Sm, Eu, Gd, Tb, Dy, Ho, Er, Tm, Yb and Lu or a mixture of two or more of these elements; B is one element selected from Ba, Sr and Ca or a mixture of two or more of these elements; C is Cu or a mixture mainly composed of Cu which comprises Cu with one element selected from Ti, V, Cr, Mn, Fe, Co, Ni and Zn or with two or more elements selected from these elements; and δ is more than zero but less than 0.5. It is effective for obtaining a further uniform texture to mix an oxide containing A and C in the above-mentioned compositional formula and an oxide containing B and C and then calcine the mixture in the same manner as above.

EXAMPLE 4

First, as raw materials, powdered $Y_2O_3$ and CuO were weighed so that Y:Cu was 1.89:1.11 and then were homogeneously mixed. The mixture was calcined at 890° C. for 3 hours in an oxidizing atmosphere to obtain an oxide having the composition of $Y_{1.89}Cu_{1.11}O_{3.395}$. Then, powdered $BaCO_3$ and CuO were weighed so that Ba:Cu was 0.9:1.1 and homogeneously mixed and calcined in the same manner as above to obtain an oxide having the composition of $Ba_{0.9}Cu_{1.1}O_2$. These two oxides were disintegrated and ground and were weighed so that Y:Ba:Cu was 1:2:3 and then molded into pellets of 25 mm in diameter×5 mm. The pellets were sintered at 1000° C. for 4 hours in an oxygen atmosphere to produce a superconducting material of a triple-layer perovskite structure deficient in oxygen. The average particle size of powders in the steps above is preferably 0.2–0.5 μm. The characteristics of the resulting superconducting material were measured to obtain a critical temperature of 90K and a current density of 4800 A/cm$^2$.

EXAMPLE 5

First, as raw materials, powdered $Y_2O_3$ and CuO were weighed so that Y:Cu was 1.26:1.74 and then were homogeneously mixed. The mixture was calcined at 890° C. for 3 hours in an oxidizing atmosphere to obtain an oxide having the composition of $Y_{1.26}Cu_{1.74}O_{2.76}$. Then, powdered $BaCO_3$ and CuO were weighed so that Ba:Cu was 1.1:0.9 and homogeneously mixed and calcined in the same manner as above to obtain an oxide having the composition of $Ba_{1.1}Cu_{0.9}O_2$. These two oxides were disintegrated and ground and were weighed so that Y:Ba:Cu was 1:2:3 and then molded into pellets of 2 mm in diameter×5 mm. The pellets were sintered at 1000° C. for 4 hours in an oxygen atmosphere to produce a superconducting material of a triple-layer perovskite structure deficient in oxygen. The average particle size of powders in the steps above is preferably 0.2–0.5 μm. The characteristics of the resulting superconducting material were measured to obtain a critical temperature of 91K and a current density of 5000 A/cm$^2$.

EXAMPLE 6

First, as raw materials, powdered $Bi_2O_3$ and CuO were weighed so that Bi:Cu was 1:1 and then were homogeneously mixed. The mixture was calcined at 750° C. for 5 hours in an oxidizing atmosphere to obtain a first intermediate product having the composition of $CuO.Bi_2O_3$. On the other hand, as raw materials, powdered $SrCO_3$, $CaCO_3$ and CuO were weighed so that Sr:Ca:Cu was 1:1:1 and homogeneously mixed and calcined at 900°–950° C. for 5 hours in an oxidizing atmosphere to obtain a second intermediate product having the composition of CuO.2CaO. Then, these first and second intermediate products were disintegrated and ground and were weighed so that Bi:Ca:Sr:Cu was 1:1:1:2 and then calcined at 860°–900° C. for 5 hours in an oxygen atmosphere. The product was disintegrated and ground and then molded into pellets of 20 mm in diameter×3 mm. The pellets were sintered at 850°–900° C. for 5 hours in an oxygen atmosphere to produce a superconducting material. The average particle size of powders in the steps above is preferably 0.2–0.5 μm. The characteristics of the resulting superconducting material were measured to obtain a critical temperature of 80K and a current density of 200 A/cm$^2$.

Although in this example, explanation is made on a Bi based oxide superconducting material represented by $BiCaSrCu_2O_{7-\delta}$, this invention is not limited to this type, but can be similarly applied to other Bi based oxide superconducting materials. In this example, the heating after mixing the first and second intermediate products comprised calcining and sintering, but the calcining step may be omitted, if necessary.

This invention has been explained with reference to a Bi-Sr-Ca-Cu-O type oxide superconducting material, however this invention can also be applied to superconducting materials of the Tl-Ca-Ba-Cu-O system (for example, $Tl_2Ca_2Ba_2Cu_3O_{7-\delta}$, $Tl_2Ca_1Ba_2Cu_2O_{7-\delta}$ and the like).

EXAMPLE 7

First, as raw materials, powdered $Y_2O_3$ and CuO were weighed so that Y:Cu was 1:1 and then were homogeneously mixed. The mixture was calcined at 900° C. for 3 hours in an oxygen atmosphere to obtain an oxide having the composition of $Y_2Cu_2O_5$. Then, powdered $BaCO_3$ and CuO were weighed so that Ba:Cu was 1:1 and homogeneously mixed and calcined in the same manner as above to obtain an oxide having the composition of $BaCuO_2$. Then, these two oxides were disintegrated and ground and were weighed so that Y:Ba:Cu was 1:2:3. Then, the product was filled in a pipe of 5 mm in outer diameter, 4 mm in inner diameter and 300 mm in length and was sintered to produce a superconducting material having a triple-layer perovskite structure deficient in oxygen and having the composition of $YBa_2Cu_3O_{7-\delta}$.

Figure 3:
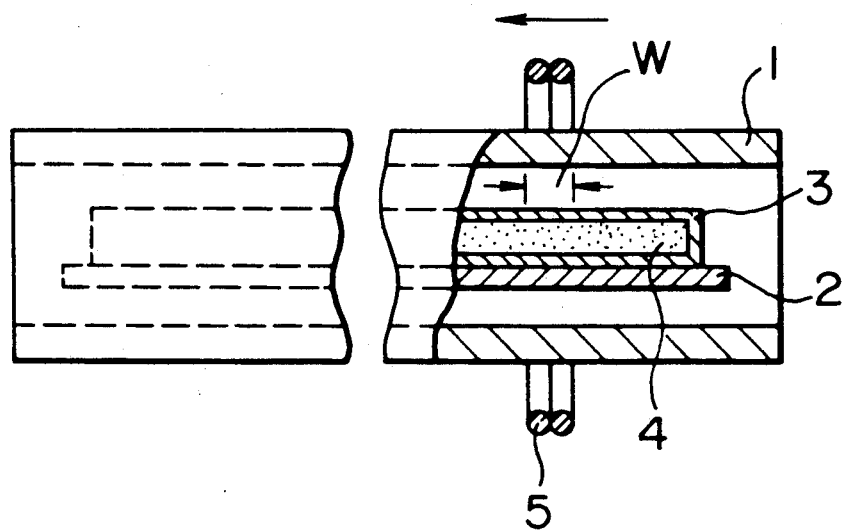
FIG. 3 is a schematic view of an apparatus used in another example of this invention.

FIG. 3 schematically shows the sintering means in the above example. In FIG. 3, 1 indicates a silica glass tube having an outer diameter of 180 mm, an inner diameter of 174 mm and a length of 1400 mm which supports pipe 3 of $Al_2O_3$ by means of supporting member 2 of SiC. 4 indicates a raw material powder and was filled in pipe 3 as mentioned above and the pipe was closed. 5 indicates a high frequency coil which is provided outside the silica glass tube 1 in such a manner that it can freely move in the axial direction.

Current was allowed to pass through the high frequency coil 5 to heat pipe 3 and raw material powder 4 to 1000°–1100° C. In this case, the high frequency coil 5 was formed to have a length of, for example, 20 mm to provide a high temperature zone w of 10–30 mm where pipe 3 and raw material powder 4 were heated. Then, the high frequency coil 5 was moved at a speed of 30 mm/Hr from the right end portion of pipe 3 in the direction indicated by the arrow and accordingly said high temperature zone also moved gradually to the left. By repeating this operation three times, it was possible to perform solid phase sintering and/or liquid phase sintering due to partial dissolution of the raw material powder filled in pipe 3. In this case, since the high temperature zone gradually moved from the right end of pipe 3 to the left, a temperature gradient was imparted to the raw material powder 4 in the pipe 3 and this causes alignment of the crystal grains and the crystal axis in the axial direction of pipe 3.

According to the conventional method, raw material powders were calcined, then disintegrated and ground, press molded into pellets of 5 mm in diameter×2 mm and then sintered at 950° C. for 4 hours in an oxygen atmosphere. Crystal grains of $YBa_2Cu_3O_{7-\delta}$ in conventional examples were distributed in the form of amorphous particles or masses and the direction of the crystal axis was not aligned at all. On the other hand, it was recognized that the crystal grains of the product of this example were completely aligned in the axial direction of pipe 3.

What is claimed is:

1. A method for producing an oxide superconducting material of layered perovskite structure having a compositional formula:

$$YBa_2Cu_3O_{7-\delta}$$

wherein δ is more than zero but less than 0.5, said process comprising the steps of:
  providing a first mixture comprised of $Y_2O_3$ and CuO;
  providing a second mixture comprised of $BaCO_3$ and CuO;
  reacting $Y_2O_3$ and CuO in said first mixture to form a first intermediate product, said first intermediate product consisting essentially of $Y_2Cu_2O_5$;
  reacting $BaCO_3$ and CuO in said second mixture to form a second intermediate product, said second intermediate product consisting essentially of $BaCuO_2$;
  mixing said first intermediate product and said second intermediate product to form an intermediate product mixture; and
  sintering said intermediate product mixture to form said oxide superconducting material.

2. The method of claim 1, wherein $Y_2O_3$ and CuO in said first mixture are calcined to form said first intermediate product, and $BaCO_3$ and CuO in said second mixture are calcined to form said second intermediate product.

3. A method for producing an oxide superconducting material of layered perovskite structure having a compositional formula:

$$YBa_2Cu_3O_{7-\delta}$$

wherein δ is more than zero but less than 0.5, said process comprising the steps of:
  contacting $Y_2O_3$ and CuO for a time sufficient to form a first intermediate product, said first intermediate product consisting essentially of $Y_2Cu_2O_5$;
  contacting $BaCO_3$ and CuO for a time sufficient to form a second intermediate product, said second intermediate product consisting essentially of $BaCuO_2$;
  mixing said first intermediate product and said intermediate product to form an intermediate product mixture; and
  sintering said intermediate product mixture to form said oxide superconducting material.

4. A method for producing an oxide superconducting material of layered perovskite structure having a compositional formula:

$$YBa_2Cu_3O_{7-\delta}$$

wherein δ is more than zero but less than 0.5, said process comprising the steps of:
  calcining $Y_2O_3$ and CuO for a time sufficient to form a first intermediate product, said first intermediate product consisting essentially of $Y_2Cu_2O_5$;
  calcining $BaCO_3$ and CuO for a time sufficient to form a second intermediate product, said second intermediate product consisting essentially of $BaCuO_2$; and
  sintering a mixture of said first intermediate product and said second itnermediate product to form said oxide superconducting material.

* * * * *